(12) United States Patent
Mehra et al.

(10) Patent No.: US 12,038,779 B2
(45) Date of Patent: Jul. 16, 2024

(54) USER CONFIGURABLE HARDWARE SETTINGS FOR OVERCLOCKING

(71) Applicant: Advanced Micro Devices, Inc., Santa Clara, CA (US)

(72) Inventors: Amitabh Mehra, Fort Collins, CO (US); William Robert Alverson, Del Valle, TX (US); Jerry Anton Ahrens, Sister Bay, WI (US); Grant Evan Ley, Eden, UT (US); Anil Harwani, Austin, TX (US); Joshua Taylor Knight, Georgetown, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/704,684

(22) Filed: Mar. 25, 2022

(65) Prior Publication Data
US 2023/0324947 A1    Oct. 12, 2023

(51) Int. Cl.
| | | |
|---|---|---|
| *G06F 1/00* | (2006.01) |
| *G06F 1/08* | (2006.01) |
| *G06F 1/20* | (2006.01) |
| *G06F 1/30* | (2006.01) |
| *G06F 1/324* | (2019.01) |
| *G06F 1/3296* | (2019.01) |

(52) U.S. Cl.
CPC ............... *G06F 1/08* (2013.01); *G06F 1/206* (2013.01); *G06F 1/305* (2013.01); *G06F 1/324* (2013.01); *G06F 1/3296* (2013.01)

(58) Field of Classification Search
CPC . G06F 1/08; G06F 1/206; G06F 1/324; G06F 1/3296
See application file for complete search history.

(56) References Cited

U.S. PATENT DOCUMENTS

| | | | |
|---|---|---|---|
| 7,382,366 B1 * | 6/2008 | Klock | G06F 11/24 714/E11.154 |
| 8,412,969 B2 | 4/2013 | Hsiao | |
| 10,009,016 B1 * | 6/2018 | Ho | G06F 1/305 |
| 10,466,737 B2 | 11/2019 | Han | |
| 10,707,877 B1 * | 7/2020 | Majumder | H03L 7/0991 |
| 11,307,773 B1 * | 4/2022 | Ring | G06F 3/0614 |
| 11,493,980 B1 * | 11/2022 | Dibbad | G06F 1/3243 |
| 2006/0022650 A1 * | 2/2006 | Vinciarelli | H02M 3/33523 323/266 |

(Continued)

OTHER PUBLICATIONS

Mehra, Amitabh , et al., "U.S. Application as Filed", U.S. Appl. No. 17/362,231, filed Jun. 29, 2021, 22 pages.

(Continued)

*Primary Examiner* — Mohammed H Rehman
(74) *Attorney, Agent, or Firm* — FIG. 1 Patents (57) ABSTRACT

User configurable hardware settings for overclocking is described. In accordance with the described techniques, user input to adjust hardware settings for operating a processing unit in an overclocking mode is received. The user input, for example, adjusts at least one of a voltage droop threshold or a frequency adjustment of the clock rate. A voltage droop is detected while operating the processing unit in the overclocking mode. Responsive to detecting the voltage droop, a clock rate of the processing unit is adjusted based at least in part on the adjusted hardware settings.

20 Claims, 6 Drawing Sheets

(56) References Cited

U.S. PATENT DOCUMENTS

| | | | |
|---|---|---|---|
| 2007/0044046 A1* | 2/2007 | Faour | G06F 30/33 |
| | | | 716/136 |
| 2009/0140748 A1* | 6/2009 | Lindsey | G01R 31/50 |
| | | | 324/538 |
| 2014/0136823 A1 | 5/2014 | Ragland et al. | |
| 2014/0168094 A1* | 6/2014 | Milne | G09B 19/02 |
| | | | 345/173 |
| 2015/0002197 A1 | 1/2015 | Chatterjee et al. | |
| 2016/0019181 A1* | 1/2016 | Tan | G06F 1/08 |
| | | | 710/300 |
| 2020/0007082 A1* | 1/2020 | Robinson | H03B 5/06 |
| 2020/0183471 A1* | 6/2020 | Liu | G06F 13/4282 |
| 2020/0304112 A1* | 9/2020 | Zhang | H02H 1/0007 |
| 2020/0310516 A1* | 10/2020 | Webel | G06F 1/28 |
| 2021/0089109 A1* | 3/2021 | Iyer | H02J 7/04 |
| 2021/0165251 A1* | 6/2021 | Smit | B32B 17/10495 |
| 2022/0413543 A1* | 12/2022 | Mehra | H03K 5/00006 |
| 2023/0136561 A1* | 5/2023 | Boujamaa | H03K 3/037 |
| | | | 375/376 |
| 2023/0188038 A1* | 6/2023 | Finn | G11C 5/14 |
| | | | 323/259 |
| 2023/0350696 A1* | 11/2023 | Harwani | G06F 13/1689 |

OTHER PUBLICATIONS

U.S. Appl. No. 17/362,231, "Non-Final Office Action", U.S. Appl. No. 17/362,231, filed Mar. 30, 2023, 8 pages.
U.S. Appl. No. 17/362,231, "Notice of Allowance", U.S. Appl. No. 17/362,231, filed Aug. 3, 2023, 7 pages.
PCT/US2023/062507, "International Search Report and Written Opinion", PCT Application No. PCT/US2023/062507, Jun. 7, 2023, 7 pages.

* cited by examiner

USER CONFIGURABLE HARDWARE SETTINGS FOR OVERCLOCKING

BACKGROUND

Processing units in an integrated circuit consume a variable amount of power depending on the processes that are executing on the processing unit. A processing unit consumes very little power while in the idle state, but power consumption increases rapidly when the processing unit is required to perform an action. Some operations require more power than others, and in cases where higher performance is demanded from the processing units, clock rates of the processing units can be increased such that the processing units are running at a frequency higher than specified, also known as "overclocking." The overclocking states typically have a higher operating voltage. One factor that negatively affects the power integrity of the circuit is the occurrence of supply voltage droops. A supply voltage droop is a temporary drop or reduction in a supply voltage provided by a power supply to one or more elements in a circuit, such as a transistor. Supply voltage droops can be the result of a drop in supply voltage provided to the power supply, an operational change to the power supply, a surge in power supply current provided by the power supply, or any combination thereof.

BRIEF DESCRIPTION OF THE DRAWINGS

The detailed description is described with reference to the accompanying figures.

DETAILED DESCRIPTION

Overview

Voltage droops can result in degradation of the maximum clock frequency or an increase in voltage needed to operate the processing unit in the overclocking mode. Some conventional processing units are configured to operate at a higher voltage in the overclocking mode in order to account for voltage droops, but doing so ends up consuming a higher amount of power than is needed for operation. As an example, if the voltage needed to operate a processing unit in the overclocking mode is 1 volt and a 50 millivolt voltage droop is expected during operation, then a conventional processing unit may choose to operate at 1.005 volts in order to continue to operate in the overclocking mode when the 50 millivolt voltage droop occurs. However, doing so wastes power of the system because the extra 50 millivolts is only needed to cover a voltage droop which may last for just a few milliseconds.

To solve the problems of conventional systems, the described techniques dynamically perform one or more actions responsive to detecting a voltage droop in order to compensate for the voltage droop. As an example, the clock of the processing unit is stretched by momentarily decreasing the clock rate in order to compensate for the voltage droop and to enable the processing unit to continue to operate in the overclocking mode. Moreover, unlike conventional systems, hardware settings associated with operating the processing unit in the overclocking mode are user configurable. For example, the hardware settings are exposed via a user interface which enables the user to adjust various hardware settings, such as by adjusting a voltage droop threshold as well as a response to the detected voltage droop. Enabling user configuration of the hardware settings associated with the overclocking mode allows the processing unit to be optimized for unique operating conditions or workloads of the system. As such, the processing unit is able to achieve a higher overclocked stable frequency, and thus better performance, than conventional processing units.

In some aspects, the techniques described herein relate to a method including: receiving user input to adjust hardware settings for operating a processing unit in an overclocking mode; detecting a voltage droop while operating the processing unit in the overclocking mode; and responsive to detecting the voltage droop, adjusting a clock rate of the processing unit based at least in part on the adjusted hardware settings.

In some aspects, the techniques described herein relate to a method, wherein the hardware settings include a voltage droop threshold and a droop response that specifies one or more actions to compensate for the voltage droop.

In some aspects, the techniques described herein relate to a method, wherein the droop response specifies an amount to decrease the clock rate of the processing unit to compensate for the voltage droop.

In some aspects, the techniques described herein relate to a method, further including exposing at least the voltage droop threshold and the droop response in a user interface.

In some aspects, the techniques described herein relate to a method, wherein the user input adjusts at least one of the voltage droop threshold or the droop response.

In some aspects, the techniques described herein relate to a method, wherein the detecting the voltage droop includes: detecting an output voltage; and determining that the voltage droop threshold is satisfied by the output voltage.

In some aspects, the techniques described herein relate to a method, wherein the adjusting the clock rate of the processing unit based at least in part on the adjusted hardware settings further includes adjusting the clock rate based on the droop response that is associated with the voltage droop threshold.

In some aspects, the techniques described herein relate to a method, wherein the voltage droop threshold and the droop response are associated with a temperature range.

In some aspects, the techniques described herein relate to a method, wherein the hardware settings further include an additional voltage droop threshold and an additional droop response that is associated with the additional voltage droop threshold, and wherein the additional voltage droop threshold and the additional droop response are associated with an additional temperature range.

In some aspects, the techniques described herein relate to a method, wherein the hardware settings are maintained in a table that is accessible by a controller, and wherein the controller updates the hardware settings responsive to the user input.

In some aspects, the techniques described herein relate to a system including: a storage device to maintain hardware settings for operating a processing unit in an overclocking mode; a controller to: detect a voltage droop while the processing unit is operating in the overclocking mode; and determine a frequency adjustment of a clock rate of the processing unit based at least in part on the hardware settings; and a clock generator to generate an output clock rate based on the determined frequency adjustment such that the processing unit maintains the overclocking.

In some aspects, the techniques described herein relate to a system, wherein the controller is further configured to expose at least a portion of the hardware settings via a user interface to enable the hardware settings to be adjusted by user input.

In some aspects, the techniques described herein relate to a system, wherein the controller is further configured to update the hardware settings maintained in the storage device responsive to user input.

In some aspects, the techniques described herein relate to a system, wherein the frequency adjustment enables the processing unit to maintain the overclocking.

In some aspects, the techniques described herein relate to a system, further including a voltage sensor to detect an output voltage of the processing unit.

In some aspects, the techniques described herein relate to a system, wherein the hardware settings include a voltage droop threshold and a droop response that that specifies an amount to decrease the clock rate of the processing unit to compensate for the voltage droop.

In some aspects, the techniques described herein relate to a system, wherein the controller detects the voltage droop by determining that the voltage droop threshold is satisfied by the output voltage detected by the voltage sensor.

In some aspects, the techniques described herein relate to a system, wherein the controller determines the frequency adjustment based on the droop response that specified the amount to decrease the clock rate of the processing unit to compensate for the voltage droop.

In some aspects, the techniques described herein relate to a system, wherein the voltage droop threshold and the droop response are associated with a temperature range.

In some aspects, the techniques described herein relate to a method including: displaying a user interface that includes user interface elements for adjusting a droop threshold and a droop response associated with operating a processing unit in an overclocking mode; receiving user input, via the user interface, to adjust the droop threshold and the droop response; detecting a voltage droop when an output voltage of the processing unit satisfies the adjusted droop threshold; and in response to detecting the voltage droop, adjusting a clock rate of the processing unit based on the adjusted droop response.

Figure 1:
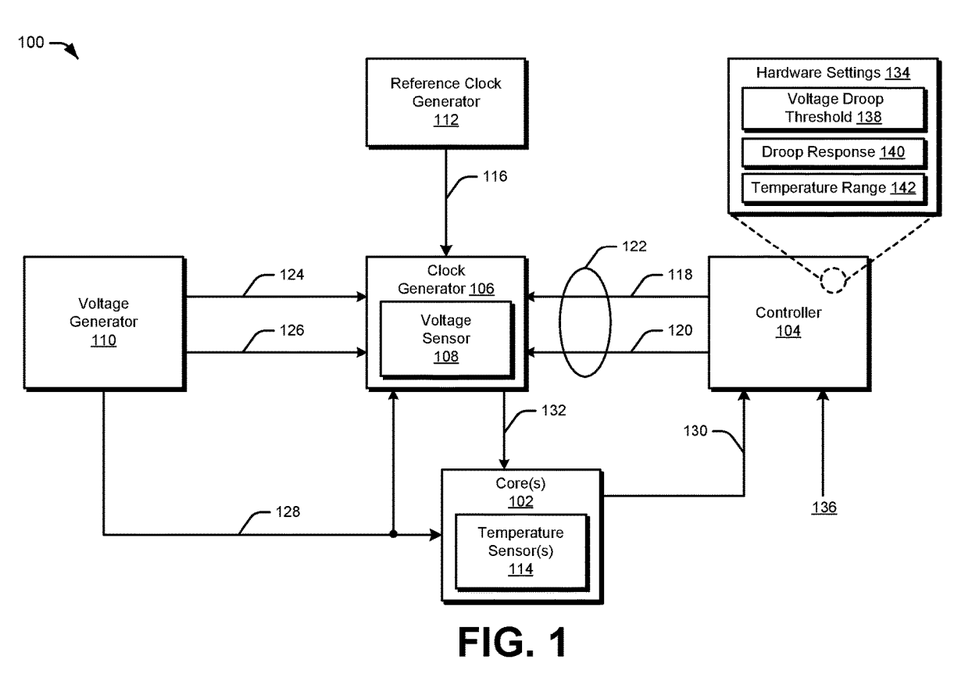
FIG. 1 illustrates a non-limiting example of a processor system operable to implement user configurable hardware settings for overclocking.

FIG. 1 illustrates a non-limiting example of a processor system 100 operable to implement user configurable hardware settings for overclocking. The processor system 100 includes one or more cores (one core 102 is depicted for simplicity) that are coupled with system firmware such as a controller 104 via a data communication bus to transmit information to and from the core 102 and the controller 104. The processor system 100 also includes a clock generator 106, a voltage sensor 108, a voltage generator 110, and a reference clock generator 112. The clock generator 106 can be implemented in a variety of different ways, such as a phase locked loop (PLL) or a frequency locked loop (FLL). In one or more implementations, the one or more cores 102 include one or more temperature sensors 114. The controller 104 can be implemented in any suitable manner such as one or more state machines, a programmable processor and/or a combination of a processor executing software instructions and one or more state machines.

The clock generator 106 is depicted as receiving a plurality of inputs from the reference clock generator 112, the controller 104, and the voltage generator 110. In the processor system 100, these inputs include a reference clock signal 116, an analog voltage supply value 118 (e.g., VDDA value), an input voltage value 120, an analog voltage supply 124 (e.g., VDDA), and an input voltage 126. In this example, the analog voltage supply value 118 and the input voltage value 120 are collectively referred to as overclock parameters 122. The voltage sensor 108 coupled with the clock generator 106 is capable of sensing and taking measurements of an output voltage 128 supplied from the voltage generator 110 to the core 102. In one or more implementations, the voltage sensor 108 is implemented in the clock generator 106. Alternatively, the voltage sensor 108 is externally located to the clock generator 106 but operatively coupled with the clock generator 106.

In one or more implementations, the controller 104 determines the overclock parameters 122 based on measured frequency 130 in the core 102. Alternatively or additionally, the controller 104 determines the overclock parameters based on frequency adjustments made to the clock rate of the core 102, as further explained herein. Based on the aforementioned inputs, the clock generator 106 generates an output clock 132 adjusted from the reference clock signal 116, which is obtained from the reference clock generator 112. The output clock 132 controls the operating frequency of the core 102. Generation of the output clock 132 based on adjustment of the reference clock signal 116 by the clock generator 106 is discussed in more detail in relation to FIG. 2.

In accordance with the described techniques, the controller 104 accesses hardware settings 134. In one or more implementations, the hardware settings 134 are maintained in a storage device (e.g., as a table) that is accessible by the controller 104. Generally, the hardware settings 134 specify settings for operation of the processor system 100 under various operating conditions. This includes specifying settings for different operating conditions with which an overclocking mode of the processor system 100 is used. Examples of such different operating conditions include, but are not limited to, different temperature ranges in which the processor system 100 is operating, performing processing for different types of applications (e.g., computer games in contrast to productivity tools), different stages related to booting up the system (e.g., during boot, post-boot, etc.), and/or other "profiles" of use of the system 100.

In contrast to conventional approaches, the controller 104 exposes the hardware settings 134 so that the settings can be adjusted by user input. In other words, the controller 104 exposes at least a portion of the hardware settings 134 in a way that enables one or more of the hardware settings to be adjusted. Such adjustments include adjusting operating conditions of a particular profile so that the controller 104 causes use of hardware settings 134 associated with the profile based on detection of the adjusted operating conditions rather than based on detection of prior operating conditions, e.g., prior to adjustment. Such adjustments also include adding a profile by defining operating conditions for which the controller 104 causes the processor system 100 to operate using hardware settings 134 associated with the profile and by specifying one or more of the associated hardware settings. Additionally or alternatively, such adjustments include adjusting the hardware settings 134 associated with an existing profile, such that the controller 104 causes the processor system 100 to use the adjusted hardware settings 134 based on detection of operating conditions of the existing profile.

In one or more implementations, the controller 104 exposes one or more portions of the hardware settings 134 to an application, which causes output (e.g., display) of a user interface for adjusting hardware settings 134 for operating one or more processing units of the processor system 100 in the overclocking mode. By way of example, the user interface presents user interface elements (e.g., menus, drop down boxes, radio buttons, dialog boxes, graphical knobs, slider bars, text boxes, and so forth) relative to which a user provides user input to define or adjust operating conditions and/or to define respective hardware settings 134 (e.g., hardware settings) to activate responsive to detecting operation under such conditions. A user interface for adjusting hardware settings 134 of the processor system 100 for operating in the overclocking mode is discussed in more detail in relation to FIG. 5.

In the illustrated example, the controller 104 is depicted receiving setting specification 136. In one or more implementations, the setting specification 136 corresponds to the user input described just above to adjust one or more hardware settings 134 and/or operating conditions for operating the processing unit in the overclocking mode. Alternatively or in addition, the setting specification 136 is received from other sources, such as from an application so that the controller 104 causes the processor system 100 to operate according to the settings specified by the setting specification 136 when the application is executing. Other example sources of settings include firmware updates (e.g., for the processor system 100) and importation of the settings from one or more files. It is to be appreciated that in variations, setting specifications 136 are received from other sources without departing from the spirit or scope of the described techniques.

In FIG. 1, the hardware settings 134 are depicted as including voltage droop threshold 138, droop response 140, and temperature range 142. These settings are merely example hardware settings 134 which are accessible by the controller 104. It is to be appreciated that the controller 104 can access other hardware settings 134 without departing from the spirit or scope of the described techniques. Thus, in various implementations, the controller 104 enables user input to adjust different settings with which the processor system 100 is operable.

As described herein, the voltage droop threshold 138 specifies an amount of voltage droop in the output voltage 128, which, once satisfied, causes the controller 104 to initiate a response of the processor system 100 to the voltage droop by performing one or more actions, e.g., by momentarily decreasing the clock rate to account for the voltage droop. The voltage droop threshold 138 is definable in different ways in various implementations. In one or more implementations, for example, the voltage droop threshold 138 is defined as a percentage of the analog voltage supply value 118, such that when the output voltage 128 as a percentage of the analog voltage supply value 118 satisfies (e.g., is less than or equal to) the voltage droop threshold 138, the controller 104 initiates a corresponding response defined by the hardware settings 134. Alternatively or in addition, the voltage droop threshold 138 is defined as a fixed offset from the analog voltage supply value 118, such that when an amount the output voltage 128 is offset from the analog voltage supply value 118 satisfies (e.g., is greater than or equal to) the voltage droop threshold 138, the controller initiates a corresponding response. Alternatively or in addition, the voltage droop threshold 138 is a fixed voltage level, such that when the output voltage 128 corresponds to a voltage level that satisfies (e.g., is less than or equal to) the threshold, the controller initiates a corresponding response. In variations, the voltage droop threshold 138 is definable in other ways.

The droop response 140 defines a response of the controller 104 to detection that a respective voltage droop threshold 138 is satisfied by the output voltage 128. Based on a detection that a voltage droop threshold 138 is satisfied, for example, the controller 104 performs one or more actions to compensate for the voltage droop. For example, in response to detecting the voltage droop, the controller sends change signals to the voltage generator 110 to set the analog voltage supply 124 and/or the input voltage 126 and sends the overclock parameters 122 indicative of those changes to the clock generator 106. In one or more implementations, the droop response 140 includes a frequency adjustment that specifies an amount that a clock rate is to be decreased to mitigate the voltage droop defined by the respective voltage droop threshold 138, e.g., by stretching the reference clock signal 116. In one or more implementations, the droop response 140 includes instructions to implement clock stretch (e.g., stretching the reference clock signal 116) to reduce the impact of the voltage droop. By way of example, a user interface exposed to the user enables the user to configure the voltage droop threshold 138 to 2.5% of the output voltage, and the droop response 140 to a frequency adjustment of 25 megahertz. Subsequently, when the output voltage decreases by 2.5% (thus satisfying the user configured voltage droop threshold), the clock rate of the processing unit is temporarily stretched by decreasing the clock rate by 25 megahertz to account for the voltage droop. An example of stretching the reference clock signal 116 based on frequency is discussed in more detail in relation to FIG. 2.

The temperature range 142 is one example of a type of operating condition with which hardware settings 134 (e.g., at least one voltage droop threshold 138 and at least one droop response 140) are associated in one or more implementations. In this example, the temperature sensors 114 detect an environmental temperature under which the cores 102 are processing instructions. If the temperature detected by the temperature sensors 114 is within the temperature range 142, then the controller 104 utilizes the voltage droop threshold 138 and the droop response 140 which correspond to the temperature range 142. In this way, when the processor system 100 operates at a temperature within the temperature range 142 and a voltage droop is detected that satisfies the respective voltage droop threshold 138, then the controller 104 signals the processor system 100 to initiate the respective droop response 140 to mitigate the voltage droop.

In one or more implementations, the hardware settings 134 include multiple different temperature ranges 142, and each of the different temperature ranges 142 has a corresponding voltage droop threshold 138 and droop response 140. As noted above, each temperature range corresponds to a profile of system operation, such that specifying multiple temperature ranges to include in the hardware settings 134 generates multiple profiles. As noted above, the hardware settings 134 are also configured to include profiles based on types of operating conditions different from temperature, such as for performing processing that corresponds to different types of applications (e.g., computer games in contrast to productivity tools) and for different stages related to booting up the system (e.g., during boot, post-boot, etc.). Certainly, profiles for other detectable operating conditions of the system 100 are used in various implementations.

In at least one example, a profile is associated with multiple voltage droop thresholds 138 and multiple droop responses 140. By having multiple voltage droop thresholds and corresponding responses, the processor system 100, while operating under particular conditions of a profile, is controlled to respond in specified (e.g., different) ways when voltage droop deviates further and further from a desired voltage. When a profile has multiple voltage droop thresholds 138 and multiple droop responses 140, for example, the controller 104 initiates a first droop response 140 responsive to detecting a voltage droop that satisfies a first voltage droop threshold 138. If the voltage droop increases beyond the first threshold, such that it subsequently satisfies a second voltage droop threshold 138, then the controller 104 initiates a corresponding second droop response 140 to mitigate an effect of the voltage droop on performance. It is to be appreciated that more than two steps, e.g., more than two voltage droop threshold 138 and corresponding droop response 140 pairs, are maintained in the hardware settings 134 for a particular profile in one or more implementations. In the context of stretching the reference clock signal 116 to overclock the processor system 100, consider the following discussion.

Figure 2:
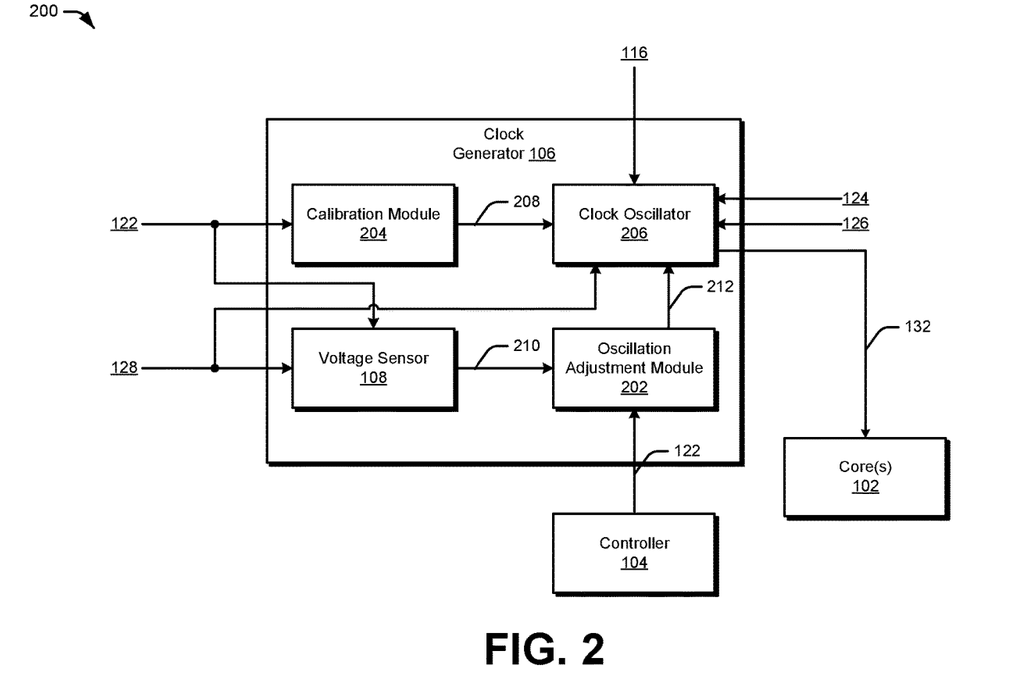
FIG. 2 illustrates a non-limiting example of a clock generator in one or more implementations.

FIG. 2 illustrates a non-limiting example 200 of a clock generator in one or more implementations. In this example 200, the clock generator 106 includes three components: an oscillation adjustment module 202, a calibration module 204, and a clock oscillator 206. The oscillation adjustment module 202 is coupled with the controller 104 to receive therefrom the overclock parameters 122, and is also coupled with the voltage sensor 108 to receive therefrom sensed output voltage 210 based on the output voltage 128 provided from the voltage generator 110. The calibration module 204 is coupled with the controller 104 to receive the overclock parameters 122. The calibration module 204 also generates corrected calibration values 208. The corrected calibration values 208 are the corrected voltage values for programming the clock oscillator 206, which includes an adaptive oscillator circuit.

The voltage sensor 108, which can be part of the clock generator 106 or an external device coupled therewith, receives the output voltage 128 provided to the core 102 as well as the overclock parameters 122, or more specifically at least the analog voltage supply value 118 (e.g., the VDDA value) corresponding to the analog voltage supply 124 from the voltage generator 110, or more specifically from an analog voltage source. The voltage sensor 108 uses the analog voltage supply value 118 to compare the output voltage 128 with the analog voltage supply 124 (e.g., the VDDA) to detect any voltage droop in the output voltage 128.

In some conventional systems, a voltage sensor receives only the output voltage and compares it with a predetermined reference VDDA value, which is less accurate than comparing the output voltage directly with the VDDA that is provided. In one or more implementations, the voltage sensor 108 facilitates a dynamic means of sensing voltage droop in the output voltage 128, by implementing a flexible output-voltage-to-VDDA comparison that is not based on a predetermined reference VDDA. An advantage of this comparison is the reduction of a margin of error corresponding to the voltage droop estimation provided by the voltage sensor 108.

The voltage sensor 108 generates a sensed output voltage 210 which includes the detection of any voltage droop in the output voltage 128. The oscillation adjustment module 202 receives the sensed output voltage 210 as well as the overclock parameters 122 and generates a frequency adjustment 212 based on the inputs, which includes instructions to adjust a clock rate of the processing system (e.g., by stretching the reference clock signal 116) to reduce the impact of the voltage droop. In one or more implementations, the frequency adjustment 212 is also based on the droop response 140, which can be adjusted based on user input as described throughout. For example, the oscillation adjustment module 202 may determine a magnitude of the frequency adjustment 212 based on a user defined frequency adjustment for the respective voltage droop threshold 138. The clock oscillator 206 receives the reference clock signal 116 and the frequency adjustment 212, as well as the output voltage 128, the corrected calibration values 208, the analog voltage supply 124 (e.g., VDDA), and the input voltage 126 from the voltage generator 110, for example. Based on these inputs, the clock oscillator 206 generates the output clock 132 for the core 102.

In accordance with the described techniques, the clock generator 106 detects the indication of overclocking via the overclock parameters 122, and the voltage sensor 108 detects the indication of voltage droop. The clock oscillator 206 generates the output clock 132 such that the reference clock signal 116 is stretched to reduce the impact of the voltage droop while maintaining the core 102 to operate in the overclocking state, that is, without reducing the operating frequency or clock rate of the core 102. As such, the clock stretching only causes a delay in the clock signal without slowing down the clock rate. With such implementation, the core 102 is capable of maintaining operation at higher performance facilitated by the overclocking while the effects of voltage droop from the voltage generator 110 are reduced.

Figure 3:
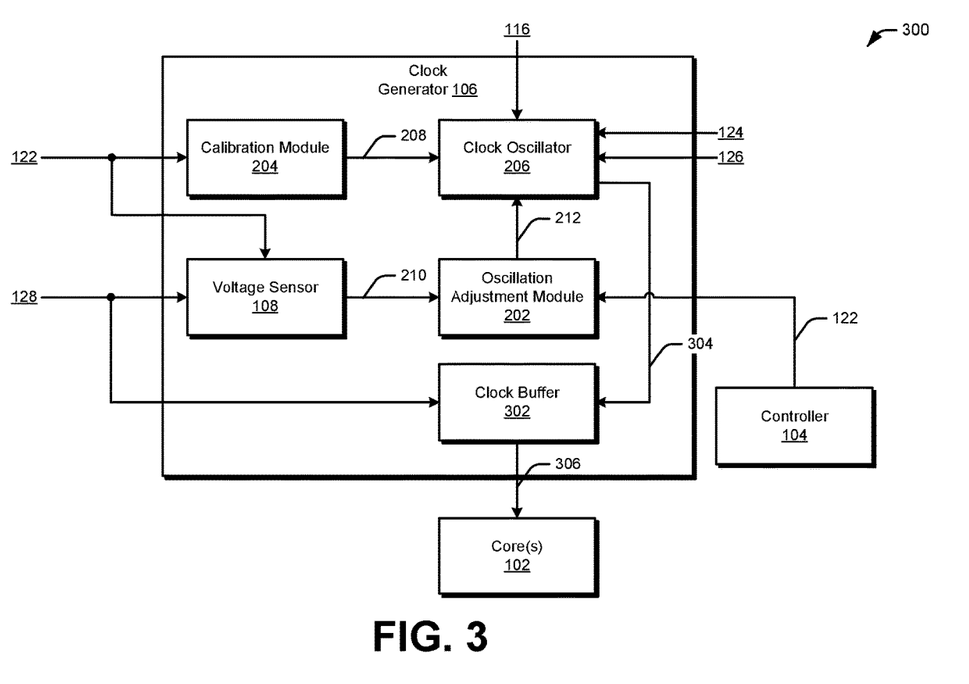
FIG. 3 illustrates another non-limiting example of the clock generator in one or more implementations.

FIG. 3 illustrates another non-limiting example 300 of the clock generator in one or more implementations. In this example 300, the clock generator 106 includes a clock buffer 302, e.g. a set of inverters, amplifiers, CML buffers, etc., which receives the output voltage 128, instead of the clock oscillator 206 receiving the output voltage 128 as shown in FIG. 2. Because the clock oscillator 206 does not receive the output voltage 128, the generated output clock is an unbuffered output clock 304, which is received by the clock buffer 302 to generate a buffered output clock 306 to be used by the core 102, or a plurality of cores. The clock buffer 302 can be any suitable type of buffer which facilitates distributing multiple copies of a clock to multiple cores with the same frequency requirements, in order to save space and costs by eliminating additional timing components, external voltage dividers, or signal-level transition circuits, for example.

Figure 4:
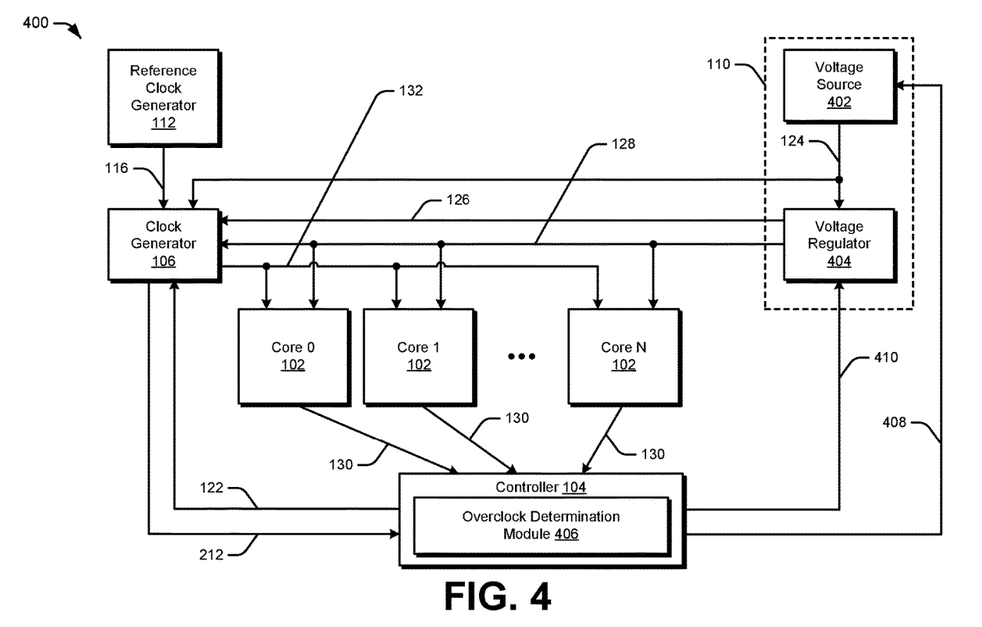
FIG. 4 illustrates a non-limiting example of a multi-processor core system in one or more implementations.

FIG. 4 illustrates a non-limiting example of a multi-processor core system 400 in one or more implementations. The system 400 includes a total of N+1 cores 102, from core 0 to core N, which can be implemented in a common integrated circuit. The voltage generator 110 in this example includes an analog voltage source 402, e.g., a VDDA 1.8V power supply, which is coupled with a voltage regulator 404. In one or more implementations, the voltage regulator 404 receives the analog voltage supply 124 (e.g., the VDDA) from the voltage source 402, regulates the supply's voltage, and distributes the output voltage 128 to each of the cores 102, as well as to the clock generator 106 as an input to those components. Thus, the voltage regulator 404 uses the supplied analog voltage supply 124 (e.g., the VDDA) to supply the output voltage 128 to each of the cores 102 as well as the clock generator 106, or more specifically to the voltage sensor 108 coupled with the clock generator 106. In one or more implementations, the voltage generator 110 is implemented in the integrated circuit which includes the cores 102. Alternatively, the voltage generator 110 is implemented separately from the integrated circuit, in one or more implementations. The voltage generator 110 provides the output voltage 128 that is variable according to a voltage level selected by the controller 104.

The system 400 also includes the controller 104 coupled to each of the cores 102, and the controller 104 receives the measured frequency 130 of each core 102 and in some cases also the frequency adjustment 212 from the cores 102, although the frequency adjustment 212 can alternatively be provided directly by the clock generator 106 as shown, or determined based on the user configurable droop response 140. The controller 104 also includes an overclock determination module 406 which determines whether to implement overclocking to increase performance of the cores 102 based on the measured frequency 130 (e.g., the present measured frequency) and the frequency adjustment 212. For example, the determination of overclocking can be in the form of changing a performance state (P-state) of the cores 102, as will be further discussed herein.

In response to determining by the overclock determination module 406 that overclocking is to be enabled, the controller 104 sends an analog voltage supply change signal 408 to the voltage source 402 as well as an input voltage change signal 410 to the voltage generator 110. The signals 408 and 410 include the values of the input voltage and VDDA as newly set by the controller 104, which are relayed to the clock generator 106 in the form of the overclock parameters 122.

In some examples, the overclock determination module 406 enables overclocking at initial system startup, that is, when the system 400 is powered up to start operation. In some examples, the overclock determination module 406 provides an adjustment request, which includes the signals 408 and 410 indicative of overclocking, based on factors such as the types of software or hardware application operating using the cores 102. Such applications can include system-intensive applications such as games that incorporate different subsystems on the computer such as hard drive, graphics, memory, and CPU, or CPU-intensive applications such as multithreaded applications including but not limited to photo editing and video transcoding applications. In some examples, the adjustment request can be provided directly via user input, for example via a user interface, when the user wishes for an increase in the system performance. In some examples, the adjustment request can be based on a feedback from the processing unit, e.g. a feedback based on the generated output clock rate, such as the cores detecting a potential need for an increase in operating frequency in order to accommodate for increased performance requirements. Any other suitable situations can be considered with regards to when and how such adjustment requests can be generated by the overclock determination module 406.

The system 400 can be any type of processor system such as a central processing unit (CPU) or a graphics processing unit (GPU). For example, the system 400 can be implemented as an x86 processor with x86 64-bit instruction set architecture and is used in desktops, laptops, servers, and superscalar computers; an Advanced Reduced Instruction Set Computer (RISC) Machine (ARM) processor that is used in mobile phones or digital media players; or a digital signal processor (DSP) that is useful in the processing and implementation of algorithms related to digital signals, such as voice data and communication signals, and microcontrollers that are useful in consumer applications, such as printers and copy machines.

The cores 102 form the computational centers of the system 400 and are responsible for performing a multitude of computational tasks. For example, the processor cores 102 can include, but are not limited to, execution units that perform additions, subtractions, shifting and rotating of binary digits, and address generation and load and store units that perform address calculations for memory addresses and the loading and storing of data from memory. The operations performed by the processor cores 102 enable the running of computer applications.

The processor cores 102 operate according to certain performance states (P-states) as controlled by the controller 104. P-states are described as follows. The Advanced Configuration and Power Interface (ACPI) standard is an operating system-based specification that regulates a computer system's power management. For example, the ACPI standard can control and direct the processor cores for better management of battery life. In doing so, ACPI assigns processor power states, referred to as C-states, and forces a processor to operate within the limits of these states. There are varying levels of C-states (e.g., C0 for a fully working state, with full power consumption and full dissipation of energy; C1 for a sleeping state, where execution of instructions are stopped and the processor can return to execute instructions instantaneously; or C2 for another sleeping state where the processor can take longer to go back to C0 state) that are assignable to a processor, causing the processor to perform in the manner specified by the respective state.

While a processor is in the fully working C0 state, it is associated with another state, referred to as the performance state or the P-state. There are varying levels of P-states that are each associated with an operating voltage and frequency. The highest performance state is P0, which can correspond to maximum operating power, voltage and frequency. However, a processor can be placed in lower performance states, for example P1 or P2, which correspond to lower operating power, voltage and/or frequency. Generally, when a processor moves to a lower P-state it will operate at a lower capacity than before.

Figure 5:
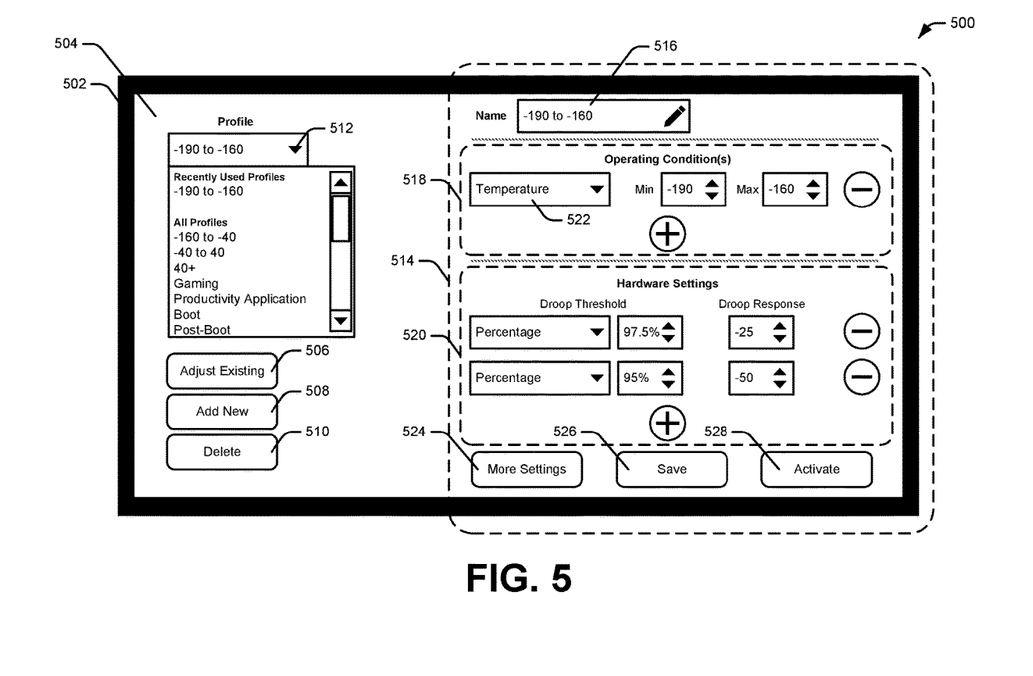
FIG. 5 depicts a non-limiting example of a user interface in one or more implementations.

FIG. 5 depicts a non-limiting example 500 of a user interface in one or more implementations. The example 500 includes a display device 502 outputting a setting adjustment user interface 504 that receives user input for adjusting settings of the hardware settings 134.

In one or more implementations, the setting adjustment user interface 504 includes user interface elements that enable a user to at least one of: adjust settings (e.g., of an existing profile), add new settings or a new profile, or delete settings or an existing profile. In variations, the setting adjustment user interface 504 includes user interface elements that enable a user to provide user input to perform different actions in relation to settings of the hardware settings 134 without departing from the spirit or scope of the described techniques.

In this example 500, the user interface 504 includes an adjust existing element 506, an add new element 508, and a delete element 510. The adjust existing element 506 is selectable by a user to adjust existing settings, e.g., the settings of a profile maintained by the hardware settings 134. The add new element 508 is selectable by a user to add new settings and/or a new profile to the hardware settings 134. The delete element 510 is selectable by a user to delete settings and/or a profile from the hardware settings 134.

In one or more implementations, as in the illustrated example, the setting adjustment user interface 504 includes a profile selection element 512, which enables a user to provide user input to select an existing profile maintained using the hardware settings 134, e.g., to cause the user interface 504 to output settings associated with a selected profile and/or to adjust settings associated with the selected profile. As noted above, the settings maintained by the hardware settings 134 and associated with a profile are used to operate in an overclocking mode in one or more implementations.

Here, the user interface 504 also includes a profile-specific portion 514. A profile-specific portion 514 is configurable in various ways in different implementations to enable adjustment of a settings profile maintained using the hardware settings 134. In this example 500, for instance, the profile-specific portion 514 displays a profile identifier 516, operating conditions 518 for which the profile is specified to be used, and hardware settings 520 associated with the profile, which control overclocking of the processor system 100 while operating under the respective operating conditions.

In the example 500, the profile identifier 514 is depicted with an edit element that is selectable by a user to edit the identifier (e.g., a name) of a profile—or to add an identifier to a new profile. The identifier is also storable in or in association with the hardware settings 134 in one or more implementations.

The operating conditions 518 in this example include a temperature range associated with the identified profile, e.g., −190 to −160. As noted above, temperature range is one type of operating condition for which overclocking settings are specifiable in accordance with the described techniques. The setting adjustment user interface 504 includes condition type element 522, which is selectable to specify a type of operating condition that is to be detected in order to use the profile. As noted above, different types of conditions include a type of application utilizing the processor system 100, a stage relative to booting the system 100, and so forth. Certainly, other types of conditions are specifiable via the setting adjustment user interface 504 for association with a set of hardware settings (e.g., overclock settings) without departing from the spirit or scope of the described techniques. Although a single operating condition is depicted in the illustrated example, it is to be appreciated that the user interface 504 and the hardware settings 134 support addition of at least one additional operating condition (e.g., a temperature range and a type of application utilizing the processing system) for a given profile, in one or more implementations.

The hardware settings 520 include one or more voltage droop thresholds 138 and one or more corresponding droop responses 140 associated with the identified profile. In this example 500, the identified profile is depicted having two voltage droop thresholds 138 and two corresponding droop responses 140 depicted as frequency adjustments. In particular, the identified profile includes a first voltage droop threshold 138 which the user has configured at 97.5% of the voltage, and a first droop response 140 which the user has configured at −25 megahertz. The identified profile also includes a second voltage droop threshold 138 which the user has configured at 95% of the voltage, and a second droop response 140 which the user has configured at −50 megahertz. Certainly, one voltage droop threshold 138 and respective droop response 140 or more than two voltage droop thresholds 138 and droop responses 140 are usable for a profile, as discussed above. With this configuration, however, the processor system 100 will decrease the clock rate by 25 megahertz when the voltage droops past the threshold of 97.5% (e.g., a 2.5% drop in voltage), and will decrease the clock rate by 50 megahertz when the voltage droops past the threshold of 95% (e.g., a 5% drop in voltage).

As also noted above, the voltage droop threshold 138 is specifiable in various ways. In this example, the voltage droop thresholds 138 are depicted as percentages. However, the user interface 504 includes elements that are selectable to change a type of threshold. For instance, the elements are selectable to change the type of voltage droop threshold to an offset of a voltage level. Moreover, the specified voltage droop thresholds 138 are displayed with elements that enable those thresholds to be individually adjusted by a user. The user interface 504 also includes elements that are selectable to enable the droop responses 140 to be individually adjusted by a user.

In this example 500, the profile-specific portion 514 of the setting adjustment user interface 504 also includes a more settings element 524, a save element 526, and an activate element 528. In implementations where there are more adjustable settings than the voltage droop threshold 138 and the droop response 140, the setting adjustment user interface 504 includes user interface elements that enable those settings to be adjusted, e.g., via the more settings element 524. The save element 526 is selectable to save adjustments made to the operating conditions and/or settings of a profile via the user interface 504. Responsive to selection of the save element 526, for example, the hardware settings 134 are updated to maintain the adjusted overclock settings, e.g., previous settings are replaced by the adjusted settings.

The activate element 528 is selectable by a user to cause the controller 104 to use the settings of the identified profile and to monitor for the specified operating conditions, e.g., such that the associated settings are used when the operating conditions are detected. In one or more implementations, absent selection of the activate element 528, the settings are maintained in the hardware settings 134 but are not used when the operating condition specified for the profile is detected. After selection of the activate element 528, the settings are used when the operating condition specified for the profile is detected. In a scenario where no operating conditions are specified for a profile, when a user selects the activate element 528, the specified hardware settings are immediately used by the system 100, such that responsive simply to detecting a specified voltage droop 138, the controller 104 causes the system to implement the corresponding droop response 140.

It is to be appreciated that the setting adjustment user interface 504 is merely one example of a user interface that is usable to adjust settings of the hardware settings 134. Different user interfaces displaying different user interface elements, and to adjust different settings, are usable to adjust settings of the hardware settings 134 without departing from the spirit or scope of the described techniques. Although the user interface is depicted being displayed via the display device 502, it is also to be appreciated that the user interface is alternatively or additionally output for interaction with a user in different ways in accordance with the described techniques, such as voice based interface presented via a voice assistant device.

Figure 6:
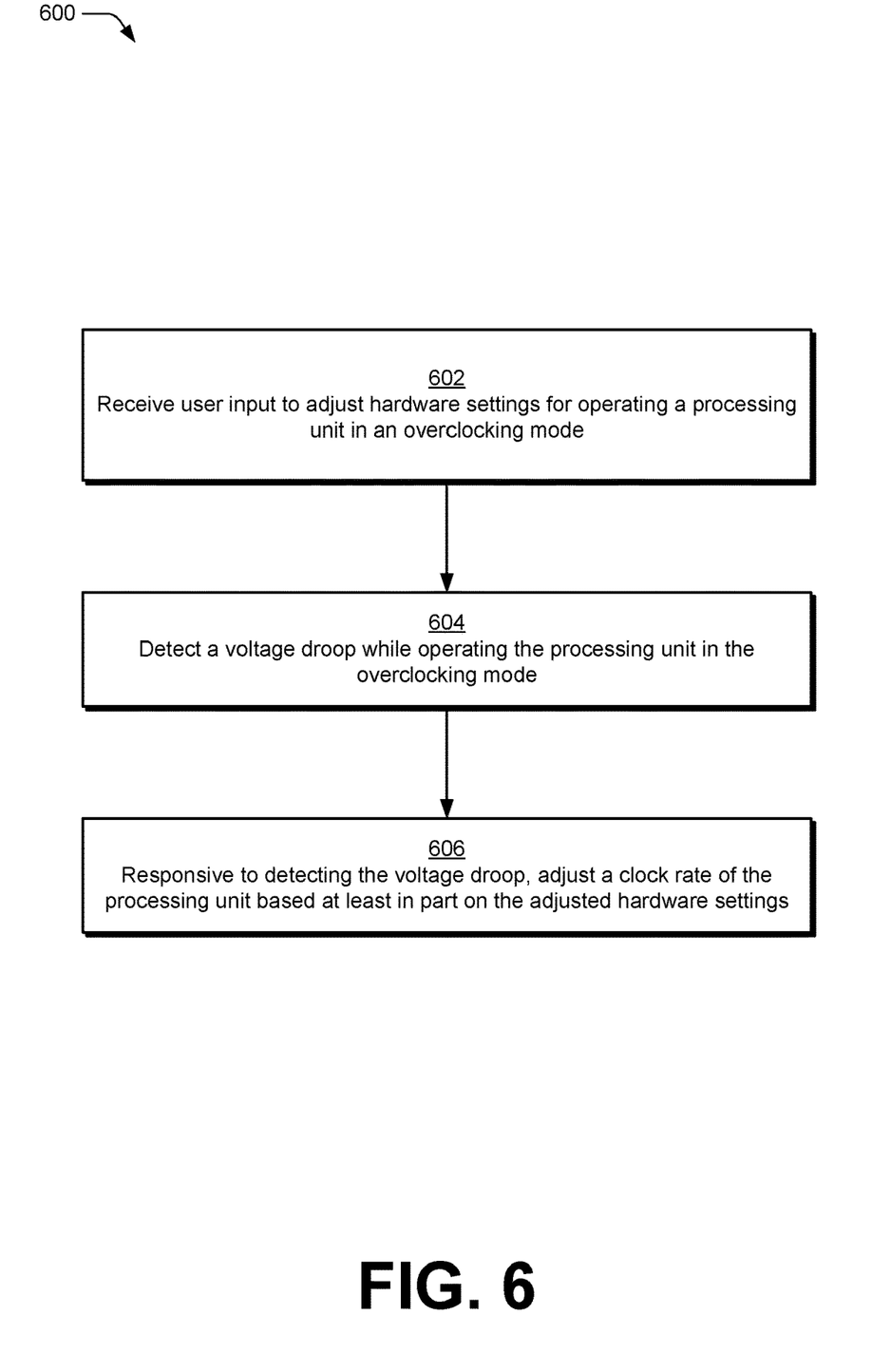
FIG. 6 depicts a procedure in an example implementation of adjusting a clock rate of a processing unit based on adjusted hardware settings.

FIG. 6 depicts a procedure 600 in an example implementation of adjusting a clock rate of a processing unit based on adjusted hardware settings.

User input to adjust hardware settings for operating a processing unit in an overclocking mode is received (block 602). By way of example, setting adjustment user interface 504 receives user input for adjusting hardware settings 134 for a processing unit, such as a CPU or GPU. The adjustment user interface 504, for example, displays hardware settings 134 such as one or more voltage droop thresholds 138 and corresponding droop responses 140 along with elements that enable those thresholds and corresponding responses to be individually adjusted by a user. As such, the user input modifies one or more voltage droop thresholds 138 and/or corresponding droop responses 140.

A voltage droop is detected while operating the processing unit in the overclocking mode (block 604). By way of example, the controller 104 detects a voltage droop when the output voltage 128 satisfies a voltage droop threshold 138. The voltage droop threshold 138 is definable in different ways in various implementations. In one or more implementations, for example, the voltage droop threshold 138 is defined as a percentage of the analog voltage supply value 118, such that when the output voltage 128 as a percentage of the analog voltage supply value 118 satisfies (e.g., is less than or equal to) the voltage droop threshold 138, the controller 104 initiates a corresponding response defined by the hardware settings 134. Alternatively or in addition, the voltage droop threshold 138 is defined as a fixed offset from the analog voltage supply value 118, such that when an amount the output voltage 128 is offset from the analog voltage supply value 118 satisfies (e.g., is greater than or equal to) the voltage droop threshold 138, the controller 104 initiates a corresponding response. Alternatively or in addition, the voltage droop threshold 138 is a fixed voltage level, such that when the output voltage 128 corresponds to a voltage level that satisfies (e.g., is less than or equal to) the threshold, the controller 104 initiates a corresponding response.

Responsive to detecting the voltage droop, a clock rate of the processing unit is adjusted based at least in part on the adjusted hardware settings (block 606). By way of example, in response to detecting the voltage droop, the controller 104 sends instructions to the clock generator 106 which causes a droop response 140 by implementing clock stretch (e.g., stretching the reference clock signal 116) to reduce the impact of the voltage droop. The adjustment is based on the adjusted hardware settings, which includes at least one of an adjusted voltage droop threshold 138 or an adjusted droop response 140. In other words, the user provides input to adjust one or both of the voltage droop threshold 138 and the droop response 140, which is utilized by the controller 104 to determine the frequency response to the voltage droop.

It should be understood that many variations are possible based on the disclosure herein. Although features and elements are described above in particular combinations, each feature or element is usable alone without the other features and elements or in various combinations with or without other features and elements.

The various functional units illustrated in the figures and/or described herein (including, where appropriate, the one or more cores 102, the controller 104, the clock generator 106, and the voltage generator 110) are implemented in any of a variety of different manners such as hardware circuitry, software or firmware executing on a programmable processor, or any combination of two or more of hardware, software, and firmware. The methods provided are implemented in any of a variety of devices, such as a general purpose computer, a processor, or a processor core. Suitable processors include, by way of example, a general purpose processor, a special purpose processor, a conventional processor, a digital signal processor (DSP), a graphics processing unit (GPU), a parallel accelerated processor, a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

In one or more implementations, the methods and procedures provided herein are implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

CONCLUSION

Although the systems and techniques have been described in language specific to structural features and/or methodological acts, it is to be understood that the systems and techniques defined in the appended claims are not necessarily limited to the specific features or acts described. Rather, the specific features and acts are disclosed as example forms of implementing the claimed subject matter.

What is claimed is:

1. A method comprising:
   displaying a user interface that includes user interface elements for adjusting a droop threshold and a droop response associated with operating a processing unit in an overclocking mode;
   receiving input, via the user interface, to adjust the droop threshold and the droop response;
   detecting a voltage droop when an output voltage of the processing unit satisfies the adjusted droop threshold; and
   in response to detecting the voltage droop, performing one or more actions to compensate for the voltage droop based on the adjusted droop response.

2. The method of claim 1, wherein the adjusted droop response specifies the one or more actions to compensate for the voltage droop.

3. The method of claim 1, wherein the one or more actions include adjusting a clock rate of the processing unit based at least in part on the adjusted droop response.

4. The method of claim 1, wherein the adjusted droop response specifies an amount to decrease a clock rate of the processing unit to compensate for the voltage droop.

5. The method of claim 1, wherein the droop threshold and the droop response are stored as hardware settings.

6. The method of claim 5, wherein the hardware settings are maintained in a table that is accessible by a controller.

7. The method of claim 5, wherein a controller updates the hardware settings responsive to the input.

8. The method of claim 1, wherein the droop threshold and the droop response are associated with a temperature range.

9. The method of claim 1, wherein the user interface elements are further operable to adjust an additional droop threshold and an additional droop response associated with the additional droop threshold.

10. The method of claim 9, wherein the droop threshold and the droop response are associated with a temperature range, and the additional droop threshold and the additional droop response are associated with an additional temperature range.

11. A system, comprising:
a processing unit; and
a controller configured to:
adjust a droop threshold and a droop response associated with operating the processing unit in an overclocking mode based on input received via a user interface, the user interface including user interface elements for adjusting the droop threshold and the droop response;
detect a voltage droop when an output voltage of the processing unit satisfies the adjusted droop threshold; and
in response to detecting the voltage droop, perform one or more actions to compensate for the voltage droop based on the adjusted droop response.

12. The system of claim 11, wherein the adjusted droop threshold and the adjusted droop response are stored as hardware settings.

13. The system of claim 12, wherein the controller is further configured to determine a frequency adjustment of a clock rate of the processing unit based at least in part on the hardware settings.

14. The system of claim 11, wherein the controller is further configured to maintain overclocking of the processing unit while the processing unit operates in the overclocking mode by adjusting a frequency of a clock rate of the processing unit.

15. The system of claim 11, wherein the controller is further configured to determine a frequency adjustment of a clock rate of the processing unit based on the adjusted droop response that specifies an amount to decrease the clock rate of the processing unit to compensate for the voltage droop.

16. The system of claim 11, wherein the adjusted droop response specifies the one or more actions to compensate for the voltage droop.

17. The system of claim 11, further comprising a voltage sensor to detect the output voltage of the processing unit.

18. The system of claim 11, wherein the droop threshold and the droop response are associated with a temperature range.

19. The system of claim 18, wherein the user interface elements are further operable to adjust an additional droop threshold and an additional droop response that is associated with the additional droop threshold, and the additional droop threshold and the additional droop response are associated with an additional temperature range.

20. A computer-readable storage medium storing executable instructions that, responsive to execution by a processing unit, causes the processing unit to perform operations including:
adjusting a droop threshold and a droop response associated with operating the processing unit in an overclocking mode based on input received via a user interface, the user interface including user interface elements for adjusting the droop threshold and the droop response;
detecting a voltage droop when an output voltage of the processing unit satisfies the adjusted droop threshold; and
in response to detecting the voltage droop, performing one or more actions to compensate for the voltage droop based on the adjusted droop response.

* * * * *